Aug. 27, 1968 W. E. DAVIS ET AL 3,399,277
SIGNAL TRANSLATING CIRCUIT
Filed May 14, 1965
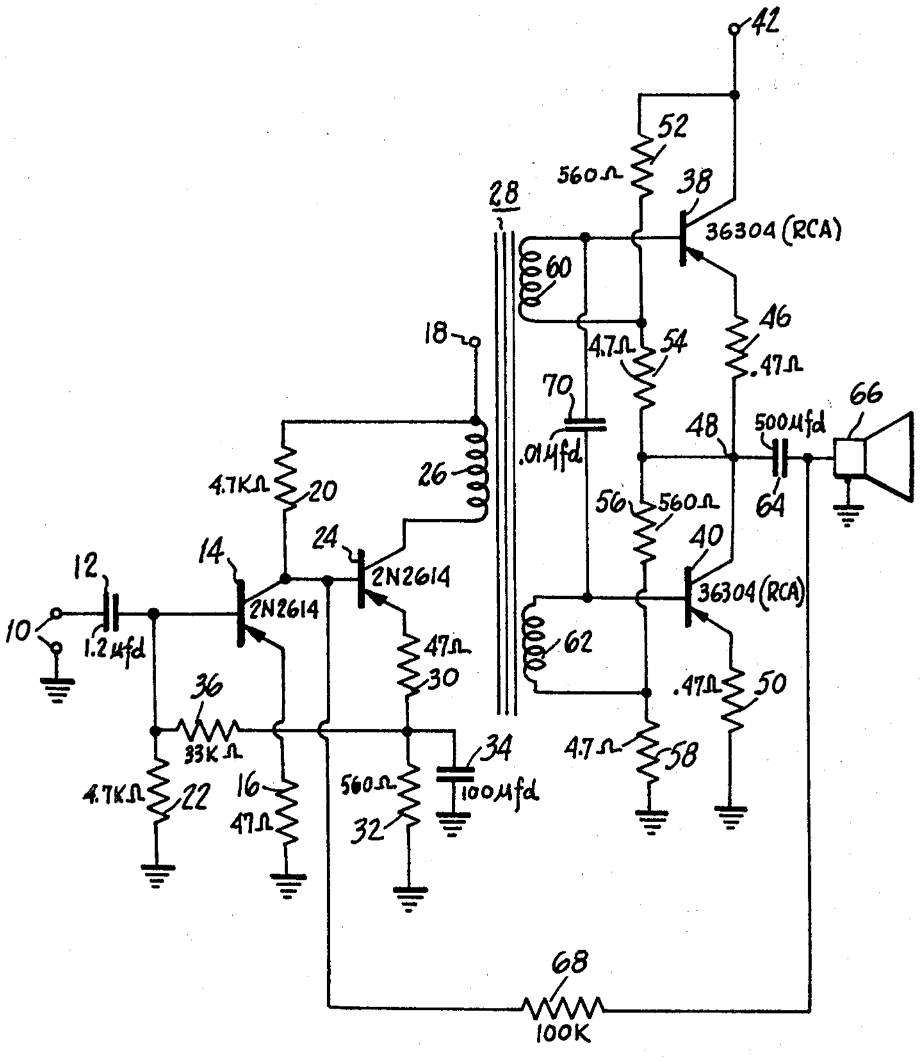
INVENTORS
WILLIAM E. DAVIS &
GEORGE P. LEE
BY Eugene M. Whitacre
Attorney United States Patent Office 3,399,277
Patented Aug. 27, 1968

3,399,277

SIGNAL TRANSLATING CIRCUIT

William Eugene Davis and George Peter Lee, Indianapolis, Ind., assignors to Radio Corporation of America, a corporation of Delaware Filed May 14, 1965, Ser. No. 455,683
6 Claims. (Cl. 179—1)

ABSTRACT OF THE DISCLOSURE

In a push-pull amplifier where feedback is employed to control the gain and frequency response, a capacitor connected between the bases of the output transistors provides a low impedance path whereby the high frequencies that produce excessive phase-shift are cancelled, thereby rendering the system more stable.

This invention relates to amplifying systems in general and more particularly to push-pull amplifying systems.

Amplifying systems are generally required to have a predictable and substantially constant gain over a given range of frequencies. This is generally designated as the gain and frequency response of the amplifying system. Since the characteristic parameters of various electronic devices employed in circuits throughout the amplifying system change from component to component, and also change with time and temperature, degenerative feedback is generally employed to provide for a means for controlling the gain and the frequency response of the system.

The amount of degenerative feedback that can be employed in any particular amplifying system is limited by the amount of phase shift introduced into the system by various reactive components such as capacitors and transformers, etc. If the phase shift is such that instability occurs when the required amount of degenerative feedback is applied (to produce the required frequency response), the open loop (no feedback) gain and phase shift response, or the feedback network must be tailored by frequency sensitive networks to provide for the required degree of stability.

In the case of high production type amplifying systems, such as the audio amplifying systems employed in television and radio receivers, these amplifying systems must economically meet the required gain and frequency response limits despite the wide variety of possible different combinations of parameters of the electronic devices employed. In these high production units, wherein economy is stressed, the cost of an individual component becomes a very important factor. The number of components employed must be minimized and the circuit must be designed to operate with off-the-shelf standard low-cost type components. Any frequency sensitive network employed to stabilize the closed loop operation of the amplifying system must also be designed by the same criterion.

It is therefore an object of this invention to provide an improved and low cost method for stabilizing push-pull amplifying systems.

It is also an object of this invention to provide a low cost means for stabilizing a push-pull amplifying system including degenerative feedback, It is still a further object of this invention to provide a low cost means for stabilizing a push-pull amplifying system requiring a minimum number of components and using components having wide tolerances.

An amplifying system including the invention includes a push-pull output stage employing a pair of amplifying devices, such as a transistor, connected to develop an output voltage across a load in a push-pull manner. Coupling means, such as a driver amplifier stage, are provided between an input circuit and the control electrodes of these amplifying devices to drive the amplifying devices in a push-pull manner. A degenerative feedback path is coupled between the load and the input circuit to provide for a predictable gain and frequency response for the amplifying system. The amplifying system is stabilized by a capacitor coupled between the control electrodes of the amplifying devices.

The novel features that are considered characteristic of this invention are set forth with particularity in the appended claims. The invention itself, however, both as to its organization and method of operation as well as additional objects and advantages thereof, will best be understood from the following description when read in connection with the accompanying drawing which is a schematic circuit diagram of a push-pull amplifying system embodying the invention.

The stabilizing circuit of the invention will be described in the context of a single-ended push-pull audio amplifier circuit. Referring to the figure, input signals to be amplified are applied across the terminals 10 and are coupled through a coupling capacitor 12 to the base electrode of a pre-amplifier transistor 14. The transistor 14 is connected as a common emitter stage with its collector electrode connected to the negative terminal 18 of a power supply, not shown, through a resistor 20 while its emitter electrode is connected to ground through a resistor 16. A biasing resistor 22 is connected between the base electrode of the transistor 14 and ground.

The collector electrode of the pre-amplifier transistor 14 is directly coupled to the base electrode of a driver transistor 24. The collector electrode of the driver transistor 24 is connected to the power supply terminal 18 through a primary winding 26 of a coupling transformer 28 while the emitter electrode is connected to ground through the series biasing resistors 30 and 32 and a bypass capacitor 34 connected in parallel with the resistor 32. A direct current feedback voltage developed across the parallel combination of the resistor 32 and the capacitor 34 is coupled to the base electrode of the pre-amplifier transistor 14 through a resistor 36. The direct current feedback through the resistor 36 effectively biases both the transistors 14 and 24 and also stabilizes their operating point for changes in temperature.

The output stage of the amplifying system of the figure is a single-ended push-pull amplifier circuit including a pair of output transistors 38 and 40. The collector electrode of the output transistor 38 is connected to a power supply terminal 42 (adapted to be connected to a power supply, not shown) while its emitter electrode is connected through a resistor 46 to an output terminal 48. The collector electrode of the output transistor 40 is directly connected to the output terminal 48 while its emitter electrode is connected to ground through the resistor 50. In effect, the direct current paths between the collector and emitter electrodes of the output transistors 38 and 40 are connected in series.

Series resistors 52, 54, 56 and 58 connected between the power supply terminal 42 and ground provide a biasing network for the output transistors 38 and 40. The junction of resistors 54 and 56 is connected to the output terminal 48.

The coupling transformer 28 includes two secondary windings 60 and 62 for driving the output transistors 38 and 40 respectively, in a push-pull manner. One end of the secondary winding 60 is connected to the junction of the biasing resistors 52 and 54 while the other end is connected to the base electrode of the output transistor 38 completing the bias and input signal circuit for the transistor 38. One end of the secondary winding 62 is connected to the junction of the biasing resistors 56 and 58 while the other end is connected to the base electrode of the output transistor 40 completing the bias and input signal circuit for the transistor 40. The polarities of the secondary windings 60 and 62 are such that the signal applied to the base electrodes of the transistors 38 and 40 are 180 degrees out of phase.

Output signals are developed at terminal 48 and are coupled through a coupling capacitor 64 to drive a loudspeaker 66. A resistor 68 is connected between the loudspeaker 66 and the base electrode of the driver transistor 24 to provide a degenerative feedback path for determining the gain and frequency response of the amplifying system. A single capacitor 70 is connected between the base electrodes of the output transistors 38 and 40 to decrease the gain of the push-pull output stage at high frequencies to stabilize the closed loop operation of the amplifying system.

In operation, the input signals that are applied across the terminals 10 are amplified by the pre-amplifier transistor 14 and the driver transistor 24 and are coupled through the coupling transformer 28 to the base electrodes of the transistors 38 and 40 as out-of-phase signals to drive the output stage in a push-pull manner. For example, if the voltage applied to the base of the transistor 38 is in a direction to increase the conduction in transistor 38, the voltage applied to the base electrode of transistor 40 is in a direction to cut-off the conduction through transistor 40. With this polarity of signal the terminal 48 approaches the value of voltage at the supply point 42. On the other hand of the signals applied to the output stage are such that the transistor 40 increases in conduction while the transistor 38 decreases in conduction, the voltage at the terminal 48 approaches that of ground. The capacitance of the coupling capacitor 64 is sufficiently high to essentially present a short circuit for signal frequencies between the output terminal 48 and the loudspeaker 66.

In order to set the gain of the amplifying system to be independent of the "beta" parameters, etc., of the particular transistors employed, a degenerative feedback path (resistor 68) is provided between the driver stage and the output stage. Because of the leakage inductance of the coupling transformer 28 and the various phase shifts attributed to the reactive components within the amplifier circuit (as designated in the figure) the circuit (without the capacitor 70) has a tendency to be unstable.

It was experimentally determined that the circuit of the figure could not be economically stabilized by tailoring the degenerative feedback path by connecting a capacitor in parallel with the resistor 68. In order to completely stabilize the amplifying system for the expected wide variations in component parameters etc., the size of such a capacitor was found to be critical requiring expensive precision, low tolerance, components and therefore was not readily adaptable to low-cost production units. In addition such a capacitance in the feedback path was found to undesirably load the pre-amplifier transistor 14. The use of two roll-off capacitors, one connected between each base electrode of the output transistors 38 and 40 and ground was also found to be unacceptable. The tolerance in the size of the roll-off capacitors that could be safely employed to stabilize the amplifying system was also small, thereby also requiring the use of expensive low tolerance capacitors. Furthermore, the roll-off capacitors contributed an undesirable amount of phase shift in the operation of the circuit. The use of a capacitor across the primary winding 26 was also found unacceptable since such a capacitor merely shifted the resonant peak of the coupling transformer 28 to a low frequency and would not effectively stabilize the circuit.

The single capacitor 70 connected between the base electrodes of the output transistors 38 and 40 fully stabilized the closed loop operation of the amplifying system. The capacitance value of the capacitor 70 was found to be substantially less than that required to stabilize the system with separate roll-off capacitors connected to each base electrode of the output transistors 38 and 40. The value of the capacitor 70 is selected to present a high impedance to frequencies in the audio range of signals (generally 50 cycles to 15 kilocycles) and a low impedance for a range of signals beyond the audio range. As previously mentioned, the voltage applied to the base electrode of the transistors 38 and 40 and across the capacitor 70 is out-of-phase. As a result, the single capacitor 70 provides a shorting type effect on the higher range frequency signals (beyond the audio range) being applied to the base electrodes of the transistors 38 and 40, decreasing the gain of the amplifier of the higher range frequencies while contributing a minimum of phase shift into the amplifying system thereby stabilizing the closed loop operation of the amplifier. The value of the capacitor 70 is not critical, wherein a standard low-cost off-the-shelf component can be used and still sufficiently stabilize the circuit for all possible variations in component parameters.

What is claimed is:

1. A push-pull amplifying system comprising:
- a pair of semiconductor devices each including first and second electrodes and a control electrode;
- a supply point and a reference point adapted to be connected to a source of energizing potential;
- an output terminal;
- a load impedance;
- circuit means coupling said load impedance to said output terminal;
- circuit means connecting the first and second electrodes of one of said semiconductor devices between said output terminal and said supply point, respectively, and circuit means connecting the first and second electrodes of the second of said semiconductor devices between said reference point and said output terminal, respectively;
- input circuit means for signals to be amplified by said push-pull amplifying system;
- second circuit means coupled between said input circuit means and said control electrodes of said pair of semiconductor devices for driving said pair of semiconductor devices in a push-pull manner;
- first degenerate feedback means coupled between said load impedance and said input circuit means; and
- second degenerate feedback means including a capacitor coupled between said control electrodes of said pair of semiconductor devices for stabilizing said circuit.

2. A signal translating circuit comprising:
- first, second and third amplifying devices each having first and second electrodes and a control electrode;
- a supply point and a reference point adapted to be connected to a source of energizing potential;
- an output terminal;
- a load impedance;
- circuit means coupling said load impedance to said output terminal;
- circuit means connecting the first and second electrodes of one of said amplifying devices between said output terminal and said supply point, respectively, and circuit means connecting the first and second electrodes of the second of said amplifying devices between said reference point and said output terminal, respectively;
- circuit means coupling said first and second electrodes of said first and second amplifying devices to drive a load impedance in a push-pull manner, said first circuit means being adapted to be connected to a source of energizing potential;
- second circuit means coupling said first and second electrodes of said third amplifying device as an amplifier circuit, said second circuit means being adapted to be connected to a source of energizing potential;
- input circuit means coupled to the control electrode of said third amplifying device for input signals to be translated;
- third circuit means coupled between said second circuit means and said control electrodes of said first and second amplifying devices for driving said first and second amplifying devices in a push-pull manner;

first degenerative feedback means coupled between said load impedance and said input circuit means, and second degenerative feedback means including a capacitor coupled between said control electrodes of said first and second amplifying devices for stabilizing said signal translating circuit.

3. A push-pull amplifying system comprising:

first, second and third transistors each having base, emitter and collector electrodes;

a supply point and a reference point adapted to be connected to a source of energizing potential;

a loudspeaker;

an output terminal;

circuit means coupling said loudspeaker to said output terminal;

circuit means connecting the emitter and collector electrodes of the first of said transistors between said output terminal and said supply point, respectively, and circuit means connecting the emitter and collector electrodes of said second transistors between said reference point and said output terminal, respectively, to drive said loudspeaker in a push-pull manner;

first circuit means for connecting the collector and emitter electrodes of said first and second transistors to drive said loudspeaker in a push-pull manner, said first circuit means being adapted to be connected to a source of energizing potential;

biasing means for developing a biasing voltage for said first and second transistors;

a coupling transformer including a primary winding and a pair of secondary windings;

circuit means coupling said pair of secondary windings between said biasing means and the base electrodes of said first and second transistors for applying biasing and signal voltage thereto, the polarity of the secondary winding being such to drive said first and second transistors in a push-pull manner;

second circuit means coupling the primary winding of said coupling transformer in a series circuit with the emitter and collector electrodes of said third transistor to provide a driver stage for said circuit including said first and second transistors;

input circuit means coupled to the base electrode of said third transistor for applying signals to be amplified, said input circuit means including biasing means for biasing said third transistor;

resistive degenerative feedback means coupled between said loudspeaker and said input circuit means for applying a degenerative feedback to provide a given gain and frequency response for said amplifying system, and capacitive feedback means including a capacitor coupled between the base electrodes of said first and second transistors for providing a means for reducing the amplifier gain at high frequencies thereby stabilizing the operation of said push-pull amplifying system.

4. A push-pull amplifying system comprising:

first, second and third transistors each having base, emitter and collector electrodes;

a supply point and a reference point adapted to be connected to a source of energizing potential;

a loudspeaker;

an output terminal;

circuit means coupling said loudspeaker to said output terminal;

circuit means connecting the emitter and collector electrodes of the first of said transistors between said output terminal and said supply point, respectively, and circuit means connecting the emitter and collector electrodes of said second transistors between said reference point and said output terminal, respectively, to drive said loudspeaker in a push-pull manner;

first circuit means for connecting the collector and emitter electrodes of said first and second transistors to drive said loudspeaker in a push-pull manner, said first circuit means being adapted to be connected to a source of energizing potential;

biasing means for developing a biasing voltage for said first and second transistors;

a coupling transformer including a primary winding and a pair of secondary windings;

circuit means coupling said pair of secondary windings between said biasing means and the base electrodes of said first and second transistors for applying biasing and signal voltages thereto, the polarity of the secondary windings being such to drive said first and second transistors in a push-pull manner;

second circuit means coupling the primary winding of said coupling transformer in a series circuit with the emitter and collector electrodes of said third transistor to provide a driver stage for said push-pull circuit including said first and second transistor, said second circuit means being adapted to be connected to a source of energizing potential;

input circuit means coupled to the base electrode of said third transistor for applying signals to be amplified, said input circuit means including biasing means for biasing said third transistor;

degenerative feedback means coupled between said loudspeaker and said input circuit means for applying a degenerative feedback to provide a given gain and frequency response for said amplifying system, and circuit means for connecting a capacitor between the base electrodes of said first and second transistors, said capacitor having a high impedance to a range of frequencies with the audio range and a substantially lower impedance for a higher range of frequencies beyond the audio range thereby reducing the gain of said push-pull stage including said first and second transistors at said range of higher frequencies providing for the stable operation of said amplifying system with degenerative feedback.

5. A push-pull amplifying system comprising:

first, second and third transistors, each having base, emitter and collector electrodes;

a supply point and a reference point adapted to be connected to a source of energizing potential;

an output terminal;

circuit means connecting the collector and emitter electrodes of said first transistor between said supply point and said output terminal;

circuit means connecting the collector and emitter electrodes of said second transistor between said output terminal and said reference point;

biasing means including a plurality of resistors connected in a series circuit between said supply point and said reference point, an intermediate point on said series circuit being connected to said output terminal;

a coupling transformer including a primary winding and a pair of secondary windings;

circuit means connecting said primary winding between said supply point and a collector electrode of said third transistor;

circuit means connecting the emitter electrode of said third transistor to said reference point;

input circuit means for applying signals to be amplified;

circuit means coupling said input circuit means to the base electrode of said third transistor, said circuit means including biasing means for biasing said third transistor into conduction;

circuit means connecting one of said pair of secondary windings between a point on said series circuit between said output terminal and said supply point, and said base electrode of said first transistor;

circuit means connecting the other one of said pair of secondary windings between a point on said series circuit between the output terminal and said reference point, and said base electrode of said second transistor;

the polarity of said pair of secondary windings being such to produce out-of-phase signals on said base electrodes of said first and second transistors for driving said first and second transistors in a push-pull manner;

degenerative resistive feedback means coupled between said output terminal and said base electrode of said third transistor, and degenerative capacitive feedback means including a capacitor coupled between the base electrodes of said first and second transistors for stabilizing operation of said amplifying system with said degenerative resistive feedback.

6. A push-pull amplifying system comprising:

first and second semiconductor devices including first and second electrodes and a control electrode;

a supply point and a reference point adapted to be connected to a source of energizing potential;

first circuit means connecting one of the first and second electrodes of said first semiconductor device to one of said first and second electrodes of said second semiconductor device;

second circuit means connecting the other of said first and second electrodes of said first semiconductor device and the other of said first and second electrodes of said second semiconductor device to form a direct current path between said supply point and said reference point;

an output circuit coupled to said first circuit means;

input circuit means for applying signals to be amplified by said amplifying system;

third circuit means coupled between said input circuit means and said control electrodes of said first and second semiconductor devices for applying signals to the control electrodes of said first and second semiconductor devices, said signals being applied to the control electrode of said first semiconductor device being 180° out-of-phase with the signals on the control electrode of said second semiconductor whereby said first and second semiconductor devices are driven in a push-pull manner;

degenerative feedback means coupled between said output circuit and said input circuit, and capacitive means coupled between said control electrodes of said first and second semiconductor devices, the impedance of said capacitive means being such to reduce the open feedback loop gain of said amplifying system at high frequencies thereby providing for stabilizing the operation of said amplifying system with degenerative feedback.

References Cited

UNITED STATES PATENTS

| | | | |
|---|---|---|---|
| 3,258,704 | 6/1966 | Wittman | 330—15 |
| 3,231,827 | 1/1966 | Legler | 330—15 |
| 3,142,807 | 7/1964 | Sharma | 330—15 |
| 2,762,870 | 9/1956 | Sziklai et al. | 179—1 |

KATHLEEN H. CLAFFY, *Primary Examiner.*

R. P. TAYLOR, *Assistant Examiner.*

Disclaimer 3,399,277.—*William Eugene Davis* and *George Peter Lee*, Indianapolis, Ind. SIGNAL TRANSLATING CIRCUIT. Patent dated Aug. 27, 1968. Disclaimer filed Apr. 10, 1972, by the assignee, *Radio Corporation of America.*

Hereby enters this disclaimer to all claims of said patent.

[*Official Gazette July 11, 1972.*]